United States Patent [19]

Strube et al.

[11] Patent Number: 4,650,548
[45] Date of Patent: Mar. 17, 1987

[54] PROCESS FOR PRESERVING THE SOLDERABILITY OF THROUGH HOLE PLATED PRINTED CIRCUIT BOARDS

[75] Inventors: Gernot Strube, Geislingen; Manfred Jordan, Salach, both of Fed. Rep. of Germany

[73] Assignee: Dr.-Ing. Max Schlotter GmbH & Co. KG, Geislingen/Steige, Fed. Rep. of Germany

[21] Appl. No.: 794,659

[22] Filed: Nov. 4, 1985

[30] Foreign Application Priority Data

Nov. 7, 1984 [DE] Fed. Rep. of Germany ....... 3440668

[51] Int. Cl.$^4$ ............................................... C25D 5/02
[52] U.S. Cl. .................................................... 204/15
[58] Field of Search .............................. 204/15, 24, 40

[56] References Cited

U.S. PATENT DOCUMENTS 2,872,391 2/1959 Hauser ................................... 204/15
3,673,680 7/1972 Tanaka ................................... 204/15
4,525,246 6/1985 Needham .............................. 204/15

FOREIGN PATENT DOCUMENTS 1920585 11/1969 Fed. Rep. of Germany ........ 204/15

OTHER PUBLICATIONS

Bogenschutz, Oberflachentechnik und Galvanotechnik in der Elektronik, p. 46, 1971.

Primary Examiner—T. M. Tufariello
Attorney, Agent, or Firm—Hoffmann, Dilworth, Barrese & Baron

[57] ABSTRACT

A process for preserving over long storage periods the solderability of tin-lead coatings on copper or copper-based alloys on through hole plated printed circuit boards is described in which an intermediate layer of lead is deposited before the deposition of a tin-lead alloy. Printed circuit boards produced in this manner show an improved soldering behavior.

4 Claims, 5 Drawing Figures

REMELTED TIN-LEAD COATING

SOLDER  CIRCUIT BUILD-UP  SOLDER

POOR SOLDER RISE  GOOD SOLDER RISE

MAGNIFICATION 200 x
1 mm = 4.7 μm

MAGNIFICATION 500 x
1 mm = 1.9 μm

MAGNIFICATION 200 x
1 mm = 4.7 μm

MAGNIFICATION 500 x
1 mm = 1.9 μm

PROCESS FOR PRESERVING THE SOLDERABILITY OF THROUGH HOLE PLATED PRINTED CIRCUIT BOARDS

The invention refers to the production of printed circuit boards according to the metal resist technique.

Through hole plated printed circuit boards which show a tin-lead coating as a top layer are produced by the metal resist technique according to the following production principle:

1. Drilling of the double sided copper clad laminate.
2. Chemical deposition of copper in the drilled holes and on the copper clad.
3. Electrolytic reinforcement of the copper chemically deposited (if that coating is not sufficiently thick for further processing).
4. Production of a galvano resist by screen printing or by photo resist technique.
5. Reinforcement of the conductive pattern by electrolytic deposition of copper in those places not coated with galvano resist.
6. Electrolytic deposition of tin-lead on the conductive patttern of step (5).
7. Stripping off the galvano resist.
8. Etching of the copper.
9. Remelting the tin-lead coating.

Figure 1:
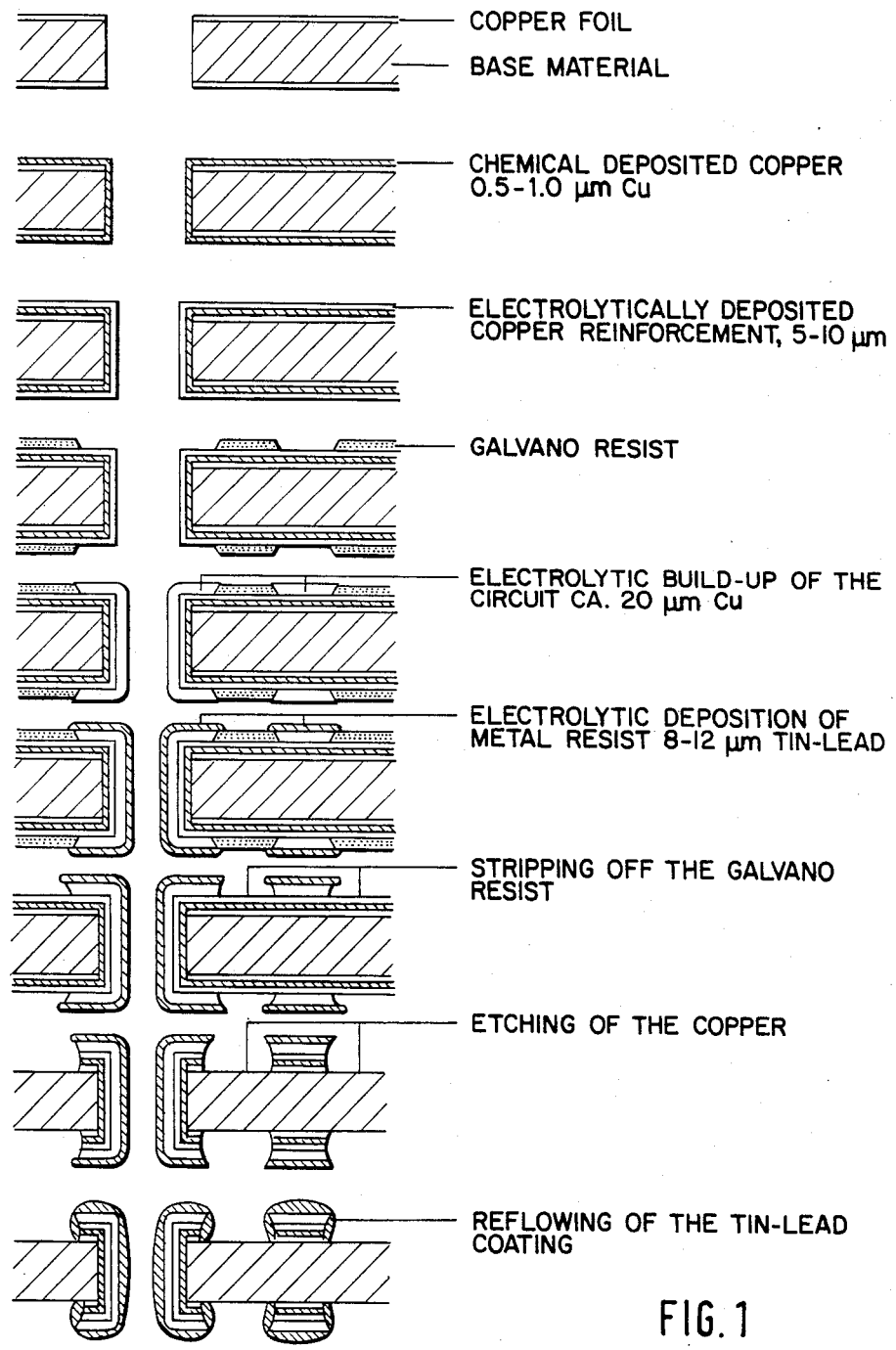

The steps of this process are shown diagrammatically in FIG. 1.

Step 3 of this process is required only if the coating thickness of the chemically deposited copper coating is less than 2.5 micron.

The electrolytic deposition of tin-lead fulfills various tasks. Firstly, the tin-lead serves as protection of the electrolytically deposited copper conductive pattern against the influence of the etching solution (step 8). Since tin-lead alloy (30 to 40% lead and 70 to 60% tin) melts at about 183° to 195° C., the laminate is not affected by the remelting. By the remelting process the tin-lead covers the edges of the conductive pattern thereby preventing corrosion of the exposed copper after the etching process. Furthermore tin-lead is a coating which can be soldered excellently.

Unfortunately the remelting process has the disadvantage that the edges of the conductive pattern are well covered by tin-lead but the thickness in the holes is not uniform; especially on the corners of the holes the thickness of tin-lead is not more than 1 micron.

Figure 2:
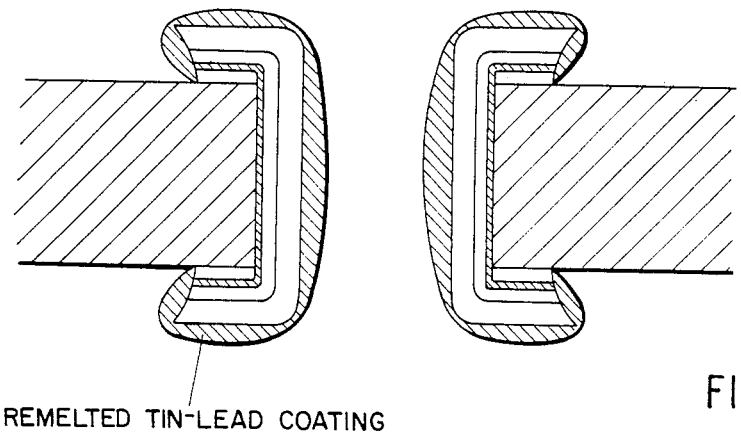

FIG. 2 shows the distribution of tin-lead in the hole.

While the tin-lead layer at the edges of the hole has the same thickness as on the surface of the board it decreases to about 0.1 to 1 micron tin-lead after remelting. The final thickness of 0.1 to 1 micron at the edges is independent of the originally deposited coating thickness (usually 8 to 12 micron tin-lead).

Figure 3:
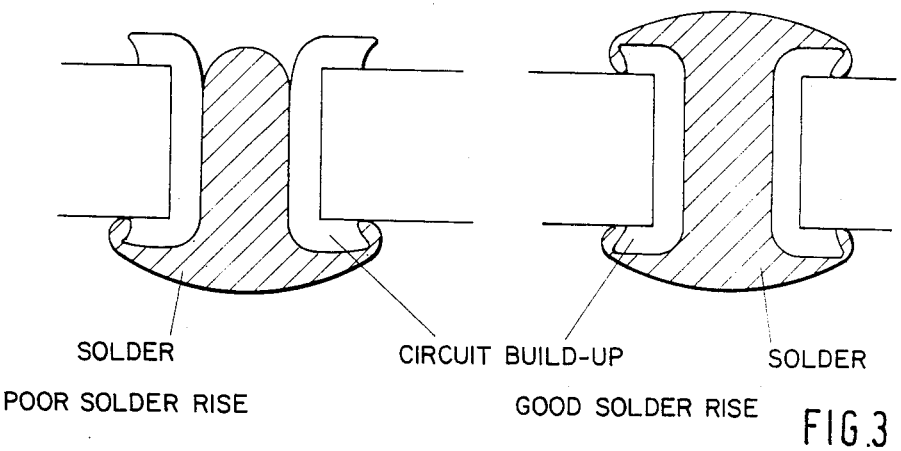

The extremely thin tin-lead coating at the edges may be sufficient for good solderability if the printed circuit board is soldered within a few days. But after a long storage period or high temperatures which simulate such long storage periods the solderability decreases. The solder does not properly fill the holes. Furthermore a convex surface forms after cooling off which is a typical example of the copper/solder borderline not being wettable any longer. FIG. 3 shows good and bad solder rise.

The poor wettability of the copper surface is due to the forming of the alloy $Cu_3Sn$. While storing or baking the printed circuit boards the tin diffuses from the tin-lead coating into the copper surface. Since after the remelting step there exists only a very thin coating at the edges of the holes the available amount of tin in this area is relatively small. During long storage periods or a corresponding baking period the not wettable phase $Cu_3Sn$ is formed instead of the tin-rich and well wettable phase $Cu_6Sn_5$.

Surprisingly it was found that the poor wettability is avoided by a thin intermediate layer of lead. This procedure is as follows:

1. Drilling of the double sided copper clad laminate.
2. Chemical deposition of copper in the drilled holes and on the copper clad.
3. Electrolytic reinforcement of the copper chemically deposited (if that coating is not sufficiently thick for further processing).
4. Production of a galvano resist by screen printing or by photo resist technique.
5. Reinforcement of the conductive pattern by electrolytic deposition of copper in those places not coated with galvano resist.
6. Electrolytic deposition of lead on the conductive pattern of step (5).
7. Electrolytic deposition of tin-lead on the conductive pattern of step (6).
8. Stripping off the galvano resist.
9. Etching of the copper.
10. Remelting tin-lead coating.

The thickness of the lead and tin-lead coatings can vary in a wide range without affecting the results of soldering. A layer combination of 1 to 5 micron of lead and 8 to 12 micron of tin-lead provides excellent results. Thicker layers are not necessary.

During the remelting process the lead coating is alloyed partly on the surface by the tin-lead layer, thereby creating a phase rich in lead in the zone near the copper surface. This lead-rich zone reduces the tin diffusion during the subsequent storing at room temperature or the subsequent accelerated ageing (tempering at 150° C.).

It is evident that the application of the various steps of the invention resulted in a thicker layer of tin-lead coating at the edges after reflowing than a process without an intermedidate layer of lead.

The following two examples demonstrate the surprising effect of the intermediate layer of lead.

EXAMPLE 1

A printed circuit board is produced from a copper clad epoxy laminate (FR4-material) as follows:
1. Drilling
2. Chemical copper deposition, 0.5 micron copper
3. Electrolytic reinforcement in a bright copper bath, 5 micron copper
4. Producing the negative mask, coating with alkali soluble photo resist foil, exposing, developing
5. Electrolytic deposition of copper, 25 micron copper
6. Electrolytic deposition of lead, 5 micron lead
7. Electrolytic deposition of tin-lead, 9 micron tin-lead (30% Pb/70% Sn)
8. Stripping off the negative mask, aqueous potassium hydroxide solution at 80° C.
9. Etching, solution of $NH_4OH/NH_4Cl/NaClO_2$ in water
10. Remelting of the tin-lead coating in a bath of water soluble oil, T=210° to 215° C., t=10 sec.
11. Baking, 155° C.; 16 h 12. Soldering; usual arrangement for wave-soldering.

Figure 4A:
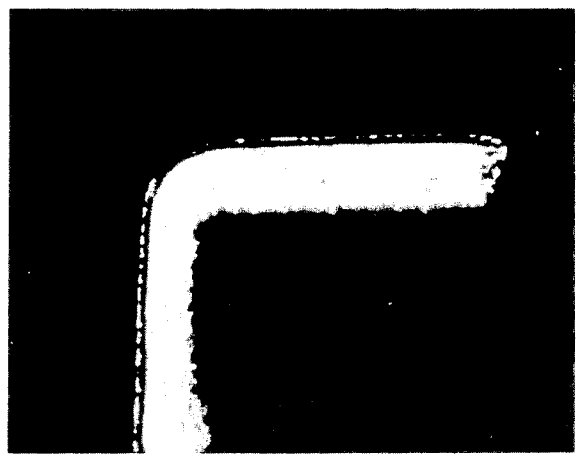
Figure 4B:

After step 10 a cross-section through a hole was made. The picture is shown in FIG. 4. Around the edges a tin-lead coating with a thickness of approximately 7 micron can be seen. The soldered printed circuit board showed a good filling of the holes by the solder.

EXAMPLE 2

Figure 5A:
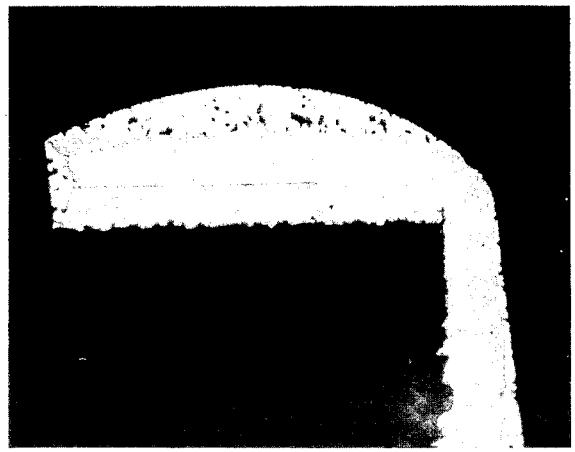
Figure 5B:
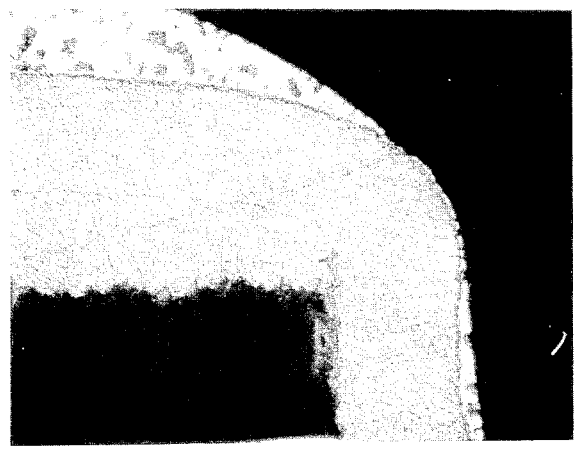

A printed circuit board is made as in example 1 but leaving out step (6). FIG. 5 shows the cross-section after step (10). Around the edges the thickness of tin-lead is beyond 1 micron. After soldering only 80% of the holes showed a good filling with solder.

We claim:

1. A process for the production of a through hole plated printed circuit board, said process comprising the steps of:
   (i) providing a double sided copper clad laminate with through holes;
   (ii) chemically depositing copper on the surfaces of said double sided copper clad laminate and on the walls of said through holes;
   (iii) applying a negative mask to the surface of said double sided copper clad laminate, said negative mask conforming to the negative configuration of a conductive pattern on said surface thereby leaving said conductive pattern exposed;
   (iv) electrolytically depositing copper on the exposed surfaces of said conductive pattern;
   (v) electrolytically depositing a layer of lead on said conductive pattern;
   (vi) electrolytically depositing a layer of a tin-lead alloy on said conductive pattern;
   (vii) removing said negative mask;
   (viii) etching the copper surfaces exposed by the removal of said negative mask;
   (ix) melting said layer of tin-lead alloy on said conductive pattern; and
   (x) rehardening said layer of tin-lead alloy on said conductive pattern.

2. The process of claim 1 wherein the copper chemically deposited on the surfaces of said double sided copper clad laminate in step (ii) is electrolytically reinforced prior to step (iii).

3. A process according to claim 1, wherein the lead layer has a thickness of 0.1 to 10 micron and the tin-lead layer has a thickness of 0.1 to 50 micron.

4. A process according to claim 1, wherein the lead layer has a thickness of 1 to 5 micron and the tin-lead layer has a thickness of 8 to 12 micron.

* * * * *